(12) United States Patent
Jiang et al.

(10) Patent No.: US 9,061,894 B2
(45) Date of Patent: Jun. 23, 2015

(54) METHOD FOR FORMING MICROELECTRODE-PAIR ARRAYS ON SILICON SUBSTRATE SURFACE WITH HYDROPHOBIC SILICON PILLARS

(75) Inventors: Lei Jiang, Beijing (CN); Bin Su, Beijing (CN); Shutao Wang, Beijing (CN); Jie Ma, Beijing (CN); Yanlin Song, Beijing (CN)

(73) Assignee: INSTITUTE OF CHEMISTRY, CHINESE ACADEMY OF SCIENCES, Beijing (CN)

( * ) Notice: Subject to any disclaimer, the term of this patent is extended or adjusted under 35 U.S.C. 154(b) by 80 days.

(21) Appl. No.: 14/009,502

(22) PCT Filed: Apr. 2, 2011

(86) PCT No.: PCT/CN2011/072446
§ 371 (c)(1),
(2), (4) Date: Dec. 18, 2013

(87) PCT Pub. No.: WO2012/135997
PCT Pub. Date: Oct. 11, 2012

(65) Prior Publication Data
US 2014/0120271 A1    May 1, 2014

(51) Int. Cl.
*B05D 5/12* (2006.01)
*B81C 1/00* (2006.01)
(Continued)

(52) U.S. Cl.
CPC ............... *B81C 1/00341* (2013.01); *B05D 1/18* (2013.01); *B05D 5/12* (2013.01); *C23C 18/04* (2013.01);
(Continued)

(58) Field of Classification Search
USPC ............. 427/598, 123, 124, 125, 126.3, 98.4, 427/98.5, 98.6, 117; 977/843, 855, 932
See application file for complete search history.

(56) References Cited

U.S. PATENT DOCUMENTS 8,268,720 B2 * 9/2012 Kamins et al. ................ 438/622
2009/0294303 A1 * 12/2009 Fischer et al. ............. 205/780.5
(Continued)

FOREIGN PATENT DOCUMENTS

CN    101941672 A    12/2011

OTHER PUBLICATIONS

English Version of Written Opinion From PCT/CN2011/072446, Mailed Jan. 19, 2012.
(Continued)

*Primary Examiner* — Brian K Talbot
(74) *Attorney, Agent, or Firm* — Calfee, Halter & Griswold LLP

(57) ABSTRACT

Provided is a method of forming large-area directionally aligned nanowires on a silicon wafer surface with hydrophobic silicon pillars so as to form microelectrode-pair arrays, which belongs to the field of electronic circuit. The method includes grafting fluoroalkylsilane on the surface of a silicon wafer with hydrophilic silicon pillar arrays; increasing the contact angle between the surface of the hydrophilic silicon pillar arrays and water from 10° to 150° above and obtaining the silicon wafer with hydrophobic silicon pillar arrays; driving water solution containing materials used for forming nanowires to flow across the surface with the hydrophobic silicon pillar arrays uniformly, so that directionally aligned nanowires are formed on the tops of each two adjacent silicon pillars in the hydrophobic silicon pillar arrays; each of the nanowires connects the two adjacent silicon pillars together so as to form a microelectrode-pair, and a plurality of microelectrode-pairs constitute the microelectrode-pair arrays.

21 Claims, 1 Drawing Sheet

(51) Int. Cl.
  H01L 29/12    (2006.01)
  B82Y 10/00    (2011.01)
  B82Y 40/00    (2011.01)
  H01L 29/417   (2006.01)
  H01L 29/66    (2006.01)
  H01L 29/06    (2006.01)
  H01L 29/16    (2006.01)
  H01L 29/41    (2006.01)
  B05D 1/18     (2006.01)
  C23C 18/04    (2006.01)
  C23C 18/18    (2006.01)
  B05D 1/02     (2006.01)
  C23C 18/31    (2006.01)
  B82Y 30/00    (2011.01)

(52) U.S. Cl.
  CPC . *C23C 18/18* (2013.01); *B05D 1/02* (2013.01); *C23C 18/31* (2013.01); *H01L 29/125* (2013.01); *B82Y 30/00* (2013.01); *B82Y 10/00* (2013.01); *B81C 1/00206* (2013.01); *B81B 2203/0361* (2013.01); *B82Y 40/00* (2013.01); *H01L 29/41725* (2013.01); *H01L 29/66439* (2013.01); *H01L 29/0649* (2013.01); *H01L 29/0673* (2013.01); *H01L 29/16* (2013.01); *H01L 29/413* (2013.01)

(56) References Cited

U.S. PATENT DOCUMENTS

2011/0062416 A1* 3/2011 Wang et al. ............... 257/14
2012/0135158 A1* 5/2012 Freer et al. ............... 427/532

OTHER PUBLICATIONS

English Version of International Preliminary Report on Patentability From PCT/CN2011/072446, Mailed Oct. 1, 2013.

Forrer et al., "Electrochemical Preparation of Surface Properties of Gold Nanowire Arrays Formed by the Template Technique," Journal of Applied Electrochemistry, 2000, vol. 3, No. 5, pp. 533-541.

* cited by examiner

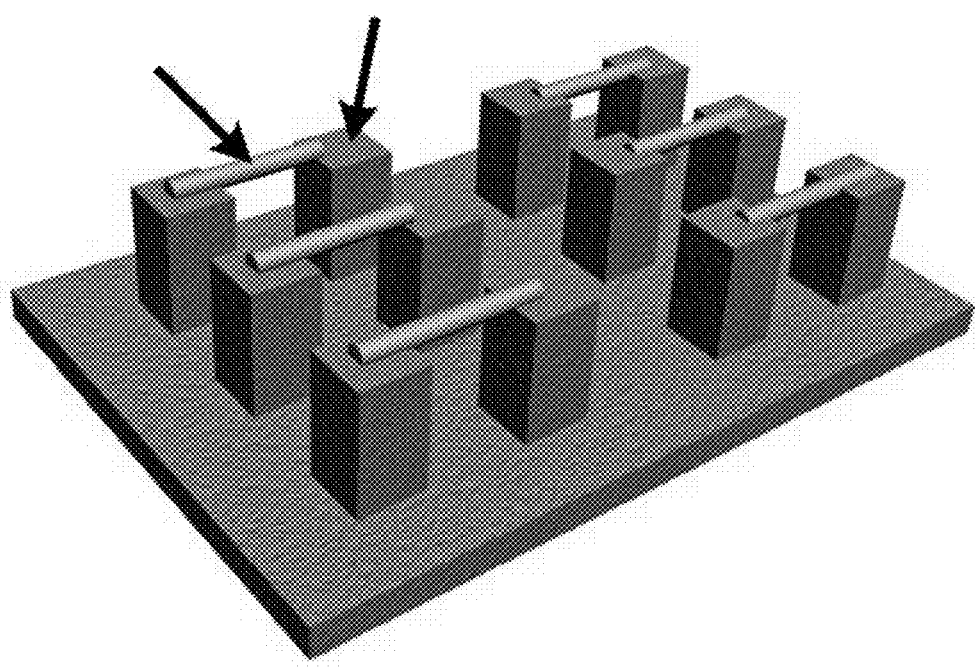

METHOD FOR FORMING MICROELECTRODE-PAIR ARRAYS ON SILICON SUBSTRATE SURFACE WITH HYDROPHOBIC SILICON PILLARS

CROSS-REFERENCE TO RELATED APPLICATION

This application is the U.S. national phase entry of PCT/CN2011/072446, with an international filing date of Apr. 02, 2011, entitled "Method for Forming Microelectrode-Pair Arrays on Silicon Substrate Surface with Hydrophobic Silicon Pillars", the entire disclosure of which are fully incorporated herein by reference.

FIELD OF THE INVENTION

The present invention belongs to the field of electronic circuit, and particularly relates to a method for forming a large-area of nanowires in a directional arrangement on the surface of a silicon wafer with hydrophobic silicon pillars and thereby building up an array of microelectrode pairs.

BACKGROUND OF THE INVENTION

Microelectrodes are electrodes with micrometer-level ($1\times10^{-6}$ m) to nanometer-level ($1\times10^{-9}$ m) linear dimension. As the linear dimension of an electrode is reduced from millimeter level to micrometer level, the electrode will exhibit many outstanding electro-chemical properties. For example, thanks to the tiny electrode size, microelectrodes are favorable for in-situ analysis; more importantly, microelectrodes have incomparable advantages over conventional electrodes, i.e., very high steady-state current density, very short response time, low polarization current, low IR drop, high mass transfer rate, high signal-to-noise ratio, support for transient electrode process study, high-impedance electrolyte and flow system. A microelectrode array is an array of monotonously arranged electrodes bundling by multiple microelectrodes, and the current flowing is the sum of currents flowing through the individual electrodes. The electrodes in a microelectrode array have the same properties as the original individual electrodes, and higher current intensity can be obtained; thus, the sensitivity of measurement is improved.

Recently, microelectrode arrays have drawn wide attention, as they have been widely applied in the fields of microelectronic circuit, bio-sensor, and micro-fluid, etc. At present, existing methods for preparing microelectrode arrays are mainly based on a top-down technique developed oversea, i.e., a silicon wafer is etched with focused laser to obtain an array of microelectrode pairs (Clendenning S B, Aouba S, Rayat M S, Grozea D, Sorge J B, Brodersen P M, Advanced Materials, 2004, vol. 16, p 215). However, such methods require expensive and complex preparation instruments, and the sample preparation process is time-consuming and inefficient. Another type of methods covers wet chemical methods (based on solvent evaporation self-assembly technique) (Ryu D Y, Shin K, Drockenmuller E, Hawker C J, Russell T P. Science, 2005, vol. 308, p 236), i.e., water or an organic solvent that contains nanowires or water or an organic solvent containing a substance that can form nanowires is spread on the silicon wafer electrode surface with a micro-pillar array; as the water or organic solvent volatilizes rapidly, the nanowires will be self-assembled to the electrode tips of the micro-pillar array. Though such methods overcome the drawback of long preparation time required for preparing an array of microelectrode pairs, the assembly result is unsatisfactory, i.e., defects often occur and local defects are often formed as a result of surface adhesion. Therefore, a preparation method that can be used to quickly produce a microelectrode array that is large in area, free of adhesion, with adjustable and controllable dimension of nanowires is required in the production of microelectrode arrays.

SUMMARY OF THE INVENTION

The object of the present invention is to provide a method for forming a large-area of directionally arranged nanowires in nanometer-level diameter on the surface of a hydrophobic micro-machined silicon wafer and thereby building up an array of microelectrode pairs, wherein, the method can adjust the thickness, length, and spatial arrangement of the nanowires.

The method for building up an array of microelectrode pairs on the surface of a silicon wafer with hydrophobic silicon pillars in the present invention comprises the following steps:

(1) immersing a silicon wafer with a hydrophilic silicon pillar array on the surface into an organic solvent that contains fluoroalkylsilane, or placing a silicon wafer with a hydrophilic silicon pillar array on the surface into an atmosphere that contains vaporized fluoroalkylsilane, or adding fluoroalkylsilane solution in droplets directly on a silicon wafer with a hydrophilic silicon pillar array on the surface; controlling the silicon wafer and the molecules of fluoroalkylsilane to have grafting reaction so that the surface of the silicon wafer is modified by the molecules of fluoroalkylsilane, to obtain a silicon wafer with a hydrophobic silicon pillar array;

(2) driving a water solution containing a substance that can form nanowires to flow across the top surface of the hydrophobic silicon pillar array on the silicon wafer obtained in step (1) at a constant flow rate in a specific direction, so that nanowires in nanometer-level diameter are formed in a directional arrangement (the direction is controllable) on the tops of adjacent silicon pillars in the hydrophobic silicon pillar array quickly in a large area, and the nanowires connect the adjacent silicon pillars together, and microelectrode pairs are formed by the adjacent silicon pillars connected by the nanowires; and forming an array of microelectrode pairs with a plurality of microelectrode pairs (as shown in FIG. 1).

In the present invention, since the silicon pillars are hydrophobic, the water solution will not infiltrate into the silicon pillars, but will stay on the tops of the silicon pillars instead; when the water solution flow across the silicon pillars, nanowires in nanometer-level diameter will be formed between the tops of adjacent silicon pillars as the water content in the water solution is vaporized, owing to the existence of surface adhesive force, as shown in FIG. 1.

The flow rate at which the water solution containing a substance that can form nanowires is driven to flow across the top surface of the hydrophobic silicon pillar array is 0.1~5 cm/s.

The driving method can utilize gravity action to drive the water solution containing a substance that can form nanowires to flow across the top surface of the hydrophobic silicon pillar array on the silicon wafer obtained in step (1) at a constant flow rate in a specific direction; or, the driving method can utilize adhesion induction action to induce the water solution containing a substance that can form nanowires with rodlets that have higher adhesive force to flow across the top surface of the hydrophobic silicon pillar array on the silicon wafer obtained in step (1) at a constant flow rate in a specific direction (since the silicon pillars are hydrophobic and have low adhesive force for water, ordinary cotton rodlets can be used to induce water droplets to move); or, the driving method can utilize physical field effect (e.g., magnetic field) to drive the water solution containing a substance that can form nanowires to flow across the top surface of the hydrophobic silicon pillar array on the silicon wafer obtained in step (1) at a constant flow rate in a specific direction (since the water solution contains a substance that can form nanowires and the substance is a paramagnetic substance (e.g., PSS-PEDOT polymer, which contains ferric iron and therefore has week paramagnetism), the water solution can be induced by means of a magnetic field).

The mass concentration of the water solution containing a substance that can form nanowires is $1 \times 10^{-9}\% \sim 20\%$.

The substance that can form nanowires can be an adulterated material prepared from a non-conducting material adulterated with metal particles, a semi-conducting material, or a conducting material.

The mass ratio of the non-conducting material to the metal particles in the adulterated material is 1:1~1:50.

The non-conducting material is one or more water soluble polymers selected from the group consisting of starch, glucose, polyvinyl alcohol, polyacrylic acid, polyethylene glycol, polyvinyl acetate, polyglycolic acid, polylactide, polylactide-polyglycolic acid, polyanhydride, and poly(α-amino acid), etc.

The particle size of the metal particles is 10~1,000 nm.

The metal is one or more selected from the group consisting of copper, silver, gold, and platinum.

The semi-conducting material is one or more selected from the group consisting of poly(3,4-ethylenedioxythiophene), polystyrene sulfonate, $Al_2O_3$, $CuO$, $NiO$, $TiO_2$, $SiO_2$, $GeO_2$, $V_2O_5$, $Mn_2O_3$, $Mn_3O_4$, $ZrO_2$, $ZnO$, $Co_3O_4$, $Nb_2O_5$, $MgTiO_3$, $PdO$, $CeO_2$, $BaTiO_3$, $La_2CuO_4$, $SnO_2$, $NiFe_2O_4$, $Fe_3O_4$, $Pb(Zr_{0.52}Ti_{0.48})O_3$, and $NiTiO_3$, etc.

The conducting material is one or more selected from the group consisting of copper particles, silver particles, gold particles, platinum particles, graphite powder, polystyrene sulfonate-poly(3,4-ethylenedioxythiophene) (PSS-PEDOT), polyphenylene vinylene, and polyoxyethylene, wherein, the particle sizes of copper particles, silver particles, gold particles and platinum particles are 10~1,000 nm.

The interval (including transverse interval and longitudinal interval) between adjacent silicon pillars is 1μm~30 μm.

In the present invention, the nanowires formed on the tops of adjacent silicon pillars in the silicon pillar array can be controlled to connect or not connect together, by adjusting the interval between the adjacent silicon pillars; if the interval between adjacent silicon pillars is greater than 30 μm, usually the nanowires formed on the tops of adjacent silicon pillars can't connect together.

The silicon pillars are in micrometer-level diameter.

In the process that the nanowires in nanometer-level diameter are formed in a directional arrangement (the direction is controllable), the direction of longitudinal arrangement of the nanowires is the flow direction of the water solution.

The silicon wafer with a hydrophilic silicon pillar array on the surface can be obtained by preparing with a conventional technique in the art; for example, the silicon wafer with a hydrophilic silicon pillar array can be prepared through a laser etching process; or, the silicon wafer with a hydrophilic silicon pillar array can be prepared through a masking and exposure process; or, the silicon wafer with a hydrophilic silicon pillar array can be prepared through a wet chemical erosion process.

The duration of grafting reaction by immersing the silicon wafer with a hydrophilic silicon pillar array on the surface into the organic solvent that contains fluoroalkylsilane is 1~24 h.

The mass concentration of fluoroalkylsilane in the organic solvent that contains fluoroalkylsilane is 1%~25%.

The organic solvent is ethanol, acetone, or dimethyl sulfoxide, etc.

The duration of grafting reaction by placing the silicon wafer with a hydrophilic silicon pillar array on the surface into the atmosphere that contains vaporized fluoroalkylsilane is 1~48 h.

The duration of grafting reaction by adding the fluoroalkylsilane solution in droplets directly on the surface of the silicon wafer with a hydrophilic silicon pillar array on the surface is 0.5-12h.

The fluoroalkylsilane is $C_8$-$C_{22}$ long-chain fluoroalkylsilane, preferably fluorododecylsilane or fluorooctodecylsilane.

The present invention utilizes a method of grafting fluoroalkylsilane on the surface of a silicon wafer that contains a hydrophilic silicon pillar array, so that the contact angle between the surface of the hydrophilic silicon pillar array and water is increased from 10° to 150° or larger, and thereby a silicon wafer that contains a hydrophobic silicon pillar array is obtained. By driving a water solution containing a substance that can form nanowires to flow across the top surface of the hydrophobic silicon pillar array at a constant flow rate in a specific direction, nanowires in nanometer-level diameter can be formed in a directional arrangement on the tops of adjacent silicon pillars in the hydrophobic silicon pillar array quickly in a large area, and the nanowires connect the adjacent silicon pillars together, and microelectrode pairs are formed; thus, an array of microelectrode pairs is formed with a plurality of microelectrode pairs. Since the area of tops of silicon pillars, the interval between silicon pillars and the wire-forming substance can be changed, the thickness, length, and spatial arrangement of the nanowires can be adjusted conveniently. The array of nanowires obtained in the present invention will not disappear within a storage period up to two months, and will have no change after being exposed to ultraviolet light for 1 h, which is to say, the nanowires have highly stable properties. The method disclosed in the present invention is easy to use and control, and the required equipment is simple; the method is suitable for use in large-scale production and is applicable to the fields of microelectronic circuit, biosensor, and micro-fluid, etc.

BRIEF DESCRIPTION OF THE DRAWINGS

FIG. 1 is a schematic diagram of an array of microelectrode pairs formed by a plurality of microelectrode pairs in the present invention.

DETAILED DESCRIPTION OF THE EMBODIMENTS

The following examples are provided only for the purpose of detailing the technical scheme of the present invention, instead of constituting any limitation to the technical scheme of the present invention.

Example 1

(1) Immerse a silicon wafer with a hydrophilic silicon pillar array on the surface prepared through a laser etching process (the interval between adjacent silicon pillars in the array is 15

μm, the silicon pillars are in micrometer-level diameter) into 1 wt % ethanol solution of fluorooctylsilane, and control the silicon wafer and the molecules of fluorooctylsilane to have grafting reaction for 12 h so that the surface of the silicon wafer is modified by the molecules of fluorooctylsilane, to obtain a silicon wafer that contains a hydrophobic silicon pillar array (the silicon pillars in the array is in micrometer-level diameter);

(2) Utilize gravity action to drive 1 wt % water solution of polyvinyl alcohol adulterated with nanometer copper particles in 10 nm particle size (the mass ratio of polyvinyl alcohol to nanometer copper particles is 1:5) to flow across the top surface of the hydrophobic silicon pillar array on the silicon wafer obtained in step (1) at 5 cm/s constant flow rate in a specific direction; as the water in the water solution is vaporized on the tops of the silicon pillars, nanowires in nanometer-level diameter are formed in an orderly and directional arrangement quickly on the tops of adjacent silicon pillars in the hydrophobic silicon pillar array in a large area, and the nanowires connect the adjacent silicon pillars together, so that microelectrode pairs are formed by the adjacent silicon pillars connected by the nanowires; thus, an array of microelectrode pairs is formed by a plurality of microelectrode pairs (at density of 31,250 electrode pairs/cm$^2$), as shown in FIG. 1.

Connect the silicon wafer with an array of microelectrode pairs obtained through the above preparation steps into a printed circuit board, and insulate the printed circuit board by encapsulating with epoxy resin, with the part to be connected to external electrodes kept exposed. Use a three-electrode system, i.e., take the silicon wafer with an array of microelectrode pairs as the working electrode, a silver electrode as the counter electrode, and a saturated calomel electrode as the reference electrode. Characterize the electro-chemical properties of the working electrode with cyclic voltammetry method in 0.5 g/L KCl solution, wherein, the potential range is −0.1V~0.6V, and the scanning rate is 50 mV/s. When the silicon wafer with an array of microelectrode pairs prepared through above steps is used as the working electrode, it can maintain a stable V-A curve, and has 0.8 s electrical response time, which is shorter by 0.7 s than the electrical response time of common copper electrodes.

The nanowires formed on the tops of adjacent silicon pillars in the silicon pillar array can be controlled to connect or not connect together, by adjusting the interval between adjacent silicon pillars in the silicon pillar array.

Example 2

(1) Immerse a silicon wafer with a hydrophilic silicon pillar array on the surface prepared through a masking and exposure process (the interval between adjacent silicon pillars in the array is 1 μm, the silicon pillars are in micrometer-level diameter) into 13% (mass percent) acetone solution of fluorodecylsilane, and control the silicon wafer and the molecules of fluorodecylsilane to have grafting reaction for 1 h so that the surface of the silicon wafer is modified by the molecules of fluorodecylsilane, to obtain a silicon wafer that contains a hydrophobic silicon pillar array (the silicon pillars in the array is in micrometer-level diameter);

(2) Utilize adhesion induction technique to induce 1×10$^{-9}$% (mass percent) water solution of poly(3,4-ethylenedioxythiophene) adhered to ordinary cotton rodlets to flow across the top surface of the hydrophobic silicon pillar array on the silicon wafer obtained in step (1) at 0.1 cm/s constant flow rate in a specific direction; as the water content in the water solution is vaporized on the tops of the silicon pillars, nanowires in nanometer-level diameter are formed in an orderly and directional arrangement on the tops of adjacent silicon pillars in the hydrophobic silicon pillar array quickly in a large area, and the nanowires connect the adjacent silicon pillars together, so that microelectrode pairs are formed by the adjacent silicon pillars connected by the nanowires; thus, an array of microelectrode pairs is formed by a plurality of microelectrode pairs (as shown in FIG. 1).

Example 3

(1) Immerse a silicon wafer with a hydrophilic silicon pillar array on the surface prepared through a wet chemical erosion process (the interval between adjacent silicon pillars in the array is 30 μm, the silicon pillars are in micrometer-level diameter) into 25% (mass percent) dimethyl sulfoxide solution of fluorododecylsilane, and control the silicon wafer and the molecules of fluorododecylsilane to have grafting reaction for 24 h so that the surface of the silicon wafer is modified completely by the molecules of fluorododecylsilane, to obtain a silicon wafer that contains a hydrophobic silicon pillar array (the silicon pillars in the array is in micrometer-level diameter);

(2) Utilize magnetic field effect to drive 20% (mass percent) water solution of polystyrene sulfonate-poly(3,4-ethylenedioxythiophene) (PSS-PEDOT) to flow across the top surface of the hydrophobic silicon pillar array on the silicon wafer obtained in step (1) at a constant flow rate in a specific direction; as the water content in the water solution is vaporized on the tops of the silicon pillars, nanowires in nanometer-level diameter are formed in an orderly and directional arrangement on the tops of adjacent silicon pillars in the hydrophobic silicon pillar array quickly in a large area, and the nanowires connect the adjacent silicon pillars together, so that microelectrode pairs are formed by the adjacent silicon pillars connected by the nanowires; thus, an array of microelectrode pairs is formed by a plurality of microelectrode pairs (at density of 31,250 electrode pairs/cm$^2$), as shown in FIG. 1.

Connect the silicon wafer with an array of microelectrode pairs obtained through the above preparation steps into a printed circuit board, and insulate the printed circuit board by encapsulating with epoxy resin, with the part to be connected to external electrodes kept exposed. Use a three-electrode system, i.e., take the silicon wafer with an array of microelectrode pairs as the working electrode, a silver electrode as the counter electrode, and a saturated calomel electrode as the reference electrode. Characterize the electro-chemical properties of the working electrode with cyclic voltammetry method in 0.5 g/L KCl solution, wherein, the potential range is −0.1V~0.6V, and the scanning rate is 50 mV/s. When the silicon wafer with an array of microelectrode pairs prepared through above steps is used as the working electrode, it can maintain a stable V-A curve, and has 0.9 s electrical response time, which is shorter by 0.6 s than the electrical response time of common copper electrodes.

The nanowires formed on the tops of adjacent silicon pillars in the silicon pillar array can be controlled to connect or not connect together, by adjusting the interval between adjacent silicon pillars in the silicon pillar array.

Example 4

(1) Place a silicon wafer with a hydrophilic silicon pillar array on the surface prepared through a laser etching process (the interval between adjacent silicon pillars in the array is 15 μm, the silicon pillars are in micrometer-level diameter) into an atmosphere that contains vaporized fluorotetradecylsilane, and control the silicon wafer and the molecules of fluorotetradecylsilane to have grafting reaction for 12 h so that the surface of the silicon wafer is modified by the molecules of fluorotetradecylsilane, to obtain a silicon wafer that contains a hydrophobic silicon pillar array (the silicon pillars in the array is in micrometer-level diameter);

(2) Utilize gravity action to drive 1% (mass percent) water solution of polyacrylic acid adulterated with nanometer silver particles in 100 nm particle size (the mass ratio of polyacrylic acid to nanometer silver particles is 1:1) to flow across the top surface of the hydrophobic silicon pillar array on the silicon wafer obtained in step (1) at a constant flow rate in a specific direction; as the water content in the water solution is vaporized on the tops of the silicon pillars, nanowires in nanometer-level diameter are formed in an orderly and directional arrangement quickly on the tops of adjacent silicon pillars in the hydrophobic silicon pillar array in a large area, and the nanowires connect the adjacent silicon pillars together, so that microelectrode pairs are formed by the adjacent silicon pillars connected by the nanowires; thus, an array of microelectrode pairs is formed by a plurality of microelectrode pairs (at density of 31,250 electrode pairs/cm$^2$), as shown in FIG. 1.

Connect the silicon wafer with an array of microelectrode pairs obtained through the above preparation steps into a printed circuit board, and insulate the printed circuit board by encapsulating with epoxy resin, with the part to be connected to external electrodes kept exposed. Use a three-electrode system, i.e., take the silicon wafer with an array of microelectrode pairs as the working electrode, a silver electrode as the counter electrode, and a saturated calomel electrode as the reference electrode. Characterize the electro-chemical properties of the working electrode with cyclic voltammetry method in 0.5 g/L KCl solution, wherein, the potential range is −0.1V~0.6V, and the scanning rate is 50 mV/s. When the silicon wafer with an array of microelectrode pairs prepared through above steps is used as the working electrode, it can maintain a stable V-A curve, and has 0.9 s electrical response time, which is shorter by 0.6 s than the electrical response time of common copper electrodes.

The nanowires formed on the tops of adjacent silicon pillars in the silicon pillar array can be controlled to connect or not connect together, by adjusting the interval between adjacent silicon pillars in the silicon pillar array.

Example 5

(1) Place a silicon wafer with a hydrophilic silicon pillar array on the surface prepared through a masking and exposure process (the interval between adjacent silicon pillars in the array is 1 μm, the silicon pillars are in micrometer-level diameter) into an atmosphere that contains vaporized fluorohexadecylsilane, and control the silicon wafer and the molecules of fluorohexadecylsilane to have grafting reaction for 1 h so that the surface of the silicon wafer is modified by the molecules of fluorohexadecylsilane, to obtain a silicon wafer that contains a hydrophobic silicon pillar array (the silicon pillars in the array is in micrometer-level diameter);

(2) Utilize adhesion induction technique to induce 1×10$^{-9}$% (mass percent) water solution of $Al_2O_3$ adhered to ordinary cotton rodlets to flow across the top surface of the hydrophobic silicon pillar array on the silicon wafer obtained in step (1) at 0.1 cm/s constant flow rate in a specific direction; as the water content in the water solution is vaporized on the tops of the silicon pillars, nanowires in nanometer-level diameter are formed in an orderly and directional arrangement on the tops of adjacent silicon pillars in the hydrophobic silicon pillar array quickly in a large area, and the nanowires connect the adjacent silicon pillars together, so that microelectrode pairs are formed by the adjacent silicon pillars connected by the nanowires; thus, an array of microelectrode pairs is formed by a plurality of microelectrode pairs (as shown in FIG. 1).

Example 6

(1) Place a silicon wafer with a hydrophilic silicon pillar array on the surface prepared through a wet chemical erosion process (the interval between adjacent silicon pillars in the array is 30 μm, the silicon pillars are in micrometer-level diameter) into an atmosphere that contains vaporized fluorooctodecylsilane, and control the silicon wafer and the molecules of fluorooctodecylsilane to have grafting reaction for 48 h so that the surface of the silicon wafer is modified completely by the molecules of fluorooctodecylsilane, to obtain a silicon wafer that contains a hydrophobic silicon pillar array (the silicon pillars in the array is in micrometer-level diameter);

(2) Utilize gravity action effect to drive 20% (mass percent) water solution of polyphenylene vinylene to flow across the top surface of the hydrophobic silicon pillar array on the silicon wafer obtained in step (1) at a constant flow rate in a specific direction; as the water content in the water solution is vaporized on the tops of the silicon pillars, nanowires in nanometer-level diameter are formed in an orderly and directional arrangement on the tops of adjacent silicon pillars in the hydrophobic silicon pillar array quickly in a large area, and the nanowires connect the adjacent silicon pillars together, so that microelectrode pairs are formed by the adjacent silicon pillars connected by the nanowires; thus, an array of microelectrode pairs is formed by a plurality of microelectrode pairs (at density of 31,250 electrode pairs/cm$^2$), as shown in FIG. 1.

Connect the silicon wafer with an array of microelectrode pairs obtained through the above preparation steps into a printed circuit board, and insulate the printed circuit board by encapsulating with epoxy resin, with the part to be connected to external electrodes kept exposed. Use a three-electrode system, i.e., take the silicon wafer with an array of microelectrode pairs as the working electrode, a silver electrode as the counter electrode, and a saturated calomel electrode as the reference electrode. Characterize the electro-chemical properties of the working electrode with cyclic voltammetry method in 0.5 g/L KCl solution, wherein, the potential range is −0.1V~0.6V, and the scanning rate is 50 mV/s. When the silicon wafer with an array of microelectrode pairs prepared through above steps is used as the working electrode, it can maintain a stable V-A curve, and has 0.8 s electrical response time, which is shorter by 0.7 s than the electrical response time of common copper electrodes.

The nanowires formed on the tops of adjacent silicon pillars in the silicon pillar array can be controlled to connect or not connect together, by adjusting the interval between adjacent silicon pillars in the silicon pillar array.

Example 7

(1) Add fluoroeicosylsilane solution in droplets directly on a silicon wafer with a hydrophilic silicon pillar array on the surface prepared through a laser etching process (the interval between adjacent silicon pillars in the array is 15 μm, the silicon pillars are in micrometer-level diameter), and control the silicon wafer and the molecules of fluoroeicosylsilane to have grafting reaction for 0.5 h, to obtain a silicon wafer that contains a hydrophobic silicon pillar array (the silicon pillars in the array is in micrometer-level diameter);

(2) Utilize gravity action to drive 1% (mass percent) water solution of polyvinyl acetate adulterated with nanometer gold particles in 1,000 nm particle size (the mass ratio of polyvinyl acetate to nanometer gold particles is 1:50) to flow across the top surface of the hydrophobic silicon pillar array on the silicon wafer obtained in step (1) at a constant flow rate in a specific direction; as the water content in the water solution is vaporized on the tops of the silicon pillars, nanowires in nanometer-level diameter are formed in an orderly and directional arrangement quickly in a large area on the tops of adjacent silicon pillars in the hydrophobic silicon pillar array, and the nanowires connect the adjacent silicon pillars together, so that microelectrode pairs are formed by the adjacent silicon pillars connected by the nanowires; thus, an array of microelectrode pairs is formed by a plurality of microelectrode pairs (at density of 31,250 electrode pairs/cm$^2$), as shown in FIG. 1.

Connect the silicon wafer with an array of microelectrode pairs obtained through the above preparation steps into a printed circuit board, and insulate the printed circuit board by encapsulating with epoxy resin, with the part to be connected to external electrodes kept exposed. Use a three-electrode system, i.e., take the silicon wafer with an array of microelectrode pairs as the working electrode, a silver electrode as the counter electrode, and a saturated calomel electrode as the reference electrode. Characterize the electro-chemical properties of the working electrode with cyclic voltammetry method in 0.5 g/L KCl solution, wherein, the potential range is −0.1V~0.6V, and the scanning rate is 50 mV/s. When the silicon wafer with an array of microelectrode pairs prepared through above steps is used as the working electrode, it can maintain a stable V-A curve, and has 0.8 s electrical response time, which is shorter by 0.7 s than the electrical response time of common copper electrodes.

The nanowires formed on the tops of adjacent silicon pillars in the silicon pillar array can be controlled to connect or not connect together, by adjusting the interval between adjacent silicon pillars in the silicon pillar array.

Example 8

(1) Add fluorodocosylsilane solution in droplets directly on a silicon wafer with a hydrophilic silicon pillar array on the surface prepared through a masking and exposure process (the interval between adjacent silicon pillars in the array is 1 μm, the silicon pillars are in micrometer-level diameter), and control the silicon wafer and the molecules of fluorodocosylsilane to have grafting reaction for 6 h, to obtain a silicon wafer that contains a hydrophobic silicon pillar array (the silicon pillars in the array is in micrometer-level diameter);

(2) Utilize adhesion induction technique to induce $1 \times 10^{-9}$% (mass percent) water solution of $NiFe_2O_4$ adhered to ordinary cotton rodlets to flow across the top surface of the hydrophobic silicon pillar array on the silicon wafer obtained in step (1) at 0.1 cm/s constant flow rate in a specific direction; as the water content in the water solution is vaporized on the tops of the silicon pillars, nanowires in nanometer-level diameter are formed in an orderly and directional arrangement on the tops of adjacent silicon pillars in the hydrophobic silicon pillar array quickly in a large area, and the nanowires connect the adjacent silicon pillars together, so that microelectrode pairs are formed by the adjacent silicon pillars connected by the nanowires; thus, an array of microelectrode pairs is formed by a plurality of microelectrode pairs (as shown in FIG. 1).

Example 9

(1) Add fluorooctodecylsilane solution in droplets directly on a silicon wafer with a hydrophilic silicon pillar array on the surface prepared through a wet chemical erosion process (the interval between adjacent silicon pillars in the array is 30 μm, the silicon pillars are in micrometer-level diameter), and control the silicon wafer and the molecules of fluorooctodecylsilane to have grafting reaction for 12 h, to obtain a silicon wafer that contains a hydrophobic silicon pillar array (the silicon pillars in the array is in micrometer-level diameter);

(2) Utilize gravity action to drive 20% (mass percent) water solution of graphite powder to flow across the top surface of the hydrophobic silicon pillar array on the silicon wafer obtained in step (1) at a constant flow rate in a specific direction; as the water content in the water solution is vaporized on the tops of the silicon pillars, nanowires in nanometer-level diameter are formed in an orderly and directional arrangement on the tops of adjacent silicon pillars in the hydrophobic silicon pillar array quickly in a large area, and the nanowires connect the adjacent silicon pillars together, so that microelectrode pairs are formed by the adjacent silicon pillars connected by the nanowires; thus, an array of microelectrode pairs is formed by a plurality of microelectrode pairs (at density of 31,250 electrode pairs/cm$^2$), as shown in FIG. 1.

Connect the silicon wafer with an array of microelectrode pairs obtained through the above preparation steps into a printed circuit board, and insulate the printed circuit board by encapsulating with epoxy resin, with the part to be connected to external electrodes kept exposed. Use a three-electrode system, i.e., take the silicon wafer with an array of microelectrode pairs as the working electrode, a silver electrode as the counter electrode, and a saturated calomel electrode as the reference electrode. Characterize the electro-chemical properties of the working electrode with cyclic voltammetry method in 0.5 g/L KCl solution, wherein, the potential range is −0.1V~0.6V, and the scanning rate is 50 mV/s. When the silicon wafer with an array of microelectrode pairs prepared through above steps is used as the working electrode, it can maintain a stable V-A curve, and has 0.8 s electrical response time, which is shorter by 0.7 s than the electrical response time of common copper electrodes.

The nanowires formed on the tops of adjacent silicon pillars in the silicon pillar array can be controlled to connect or not connect together, by adjusting the interval between adjacent silicon pillars in the silicon pillar array.

The invention claimed is:
1. A method for building an array of microelectrode pairs on the surface of a silicon wafer having hydrophobic silicon pillars, comprising the steps of:
dispensing fluoroalkylsilane on to a silicon wafer having a first surface with an array of hydrophilic silicon pillars thereon;
controlling the fluoroalkylsilane to modify the array of hydrophilic silicon pillars using a grafting reaction to produce a hydrophobic silicon pillar array on the first surface; and
driving a water solution containing a substance for forming nanowires across top surfaces of at least two adjacent hydrophobic silicon pillars at a constant flow rate to form nanowires in a directional arrangement on the tops of the adjacent silicon pillars, wherein microelectrode pairs are formed by connecting a nanowire to the adjacent silicon pillars.

2. The method according to claim 1 wherein the substance for forming nanowires is an adulterated material prepared from a non-conducting material adulterated with metal particles, a semi-conducting material, or a conducting material.

3. The method according to claim 2, wherein the dispensing step comprises immersing a silicon wafer having a hydrophilic silicon pillar array on its surface into an organic solvent containing fluoroalkylsilane.

4. The method according to claim 3, wherein a duration of the grafting reaction is about 1h~about 24h.

5. The method according to claim 3, wherein a mass concentration of fluoroalkylsilane in the organic solvent containing fluoroalkylsilane is about 1%~about 25%.

6. The method according to claim 3, wherein the organic solvent is ethanol, acetone, or dimethyl sulfoxide.

7. The method according to claim 2, wherein the dispensing step comprises placing a silicon wafer into an atmosphere containing vaporized fluoroalkylsilane.

8. The method according to claim 7, wherein a duration of grafting reaction is about 1 h~about 48 h.

9. The method according to claim 2, wherein the dispensing step comprises placing fluoroalkylsilane solution droplets directly on a silicon wafer.

10. The method according to claim 9, wherein a duration of grafting reaction is about 0.5 h~about 12 h.

11. The method according to claim 2, wherein the flow rate at which the water solution containing a substance for forming nanowires is driven to flow is about 0.1 cm/s~about 5 cm/s.

12. The method according to claim 2, wherein the mass concentration of the water solution containing a substance for forming nanowires is about $1 \times 10^{-9}$%~about 20%.

13. The method according to claim 2, wherein the driving method utilizes gravity action, adhesion induction method, or magnetic field.

14. The method according to claim 2, wherein the mass ratio of the non-conducting material to the metal particles in the adulterated material is about 1:1 ~about 1:50.

15. The method according to claim 2, wherein the particle size of the metal particles is about 10 ~about 1,000 nm.

16. The method according to claim 2, wherein the non-conducting material is one or more selected from the group consisting of starch, glucose, polyvinyl alcohol, polyacrylic acid, polyethylene glycol, polyvinyl acetate, polyglycolic acid, polylactide, polylactide-polyglycolic acid, polyanhydride, and poly(α-amino acid), the metal is one or more selected from the group consisting of copper, silver, gold, and platinum, the semi-conducting material is one or more selected from the group consisting of poly(3,4-ethylenedioxythiophene), polystyrene sulfonate, $Al_2O_3$, CuO, NiO, $TiO_2$, $SiO_2$, $GeO_2$, $V_2O_5$, $Mn_2O_3$, $Mn_3O_4$, $ZrO_2$, ZnO, $Co_3O_4$, $Nb_2O_5$, $MgTiO_3$, PdO, $CeO_2$, $BaTiO_3$, $La_2CuO_4$, $SnO_2$, $NiFe_2O_4$, $Fe_3O_4$, $Pb(Zr_{0.52}Ti_{0.48})O_3$ and $NiTiO_3$, the conducting material is one or more selected from the group consisting of copper particles, silver particles, gold particles, platinum particles, graphite powder, polystyrene sulfonate-poly(3,4-ethylenedioxythiophene), polyphenylene vinylene, and polyoxyethylene.

17. The method according to claim 16, wherein the particle sizes of copper particles, silver particles, gold particles and platinum particles are about 10~about 1,000 nm.

18. The method according to claim 2, wherein the interval between adjacent silicon pillars is about 1 μm ~about 30 μm.

19. The method according to claim 18, wherein the nanowires formed on the tops of adjacent silicon pillars are configured to connect or not connect together, by adjusting the interval between the adjacent silicon pillars.

20. The method according to claim 2, wherein the silicon pillars are in micrometer-level diameter.

21. The method according to claim 2, wherein the fluoroalkylsilane is C8-C22 long-chain fluoroalkylsilane.

\* \* \* \* \*